(12) United States Patent
Kasperkovitz

(10) Patent No.: US 7,227,912 B2
(45) Date of Patent: Jun. 5, 2007

(54) RECEIVER WITH MIRROR FREQUENCY SUPPRESSION

(75) Inventor: Wolfdietrich Georg Kasperkovitz, Waalre (NL)

(73) Assignee: Semiconductor Ideas to Market (ITOM) B.V. (NL)

( * ) Notice: Subject to any disclaimer, the term of this patent is extended or adjusted under 35 U.S.C. 154(b) by 567 days.

(21) Appl. No.: 10/486,600

(22) PCT Filed: Sep. 1, 2002

(86) PCT No.: PCT/EP02/09807

§ 371 (c)(1),
(2), (4) Date: Feb. 11, 2004

(87) PCT Pub. No.: WO03/023950

PCT Pub. Date: Mar. 20, 2003

(65) Prior Publication Data

US 2004/0248535 A1    Dec. 9, 2004

(30) Foreign Application Priority Data

Sep. 8, 2001   (EP)   ................................. 01203392

(51) Int. Cl.
*H03D 3/00*   (2006.01)
(52) U.S. Cl. .................. 375/322; 375/316; 375/376; 455/180.3
(58) Field of Classification Search ................ 375/316, 375/376, 327; 327/256, 147; 455/180.3
See application file for complete search history.

(56) References Cited

U.S. PATENT DOCUMENTS 5,220,686 A   6/1993   Kasperkovitz 5,966,400 A * 10/1999 Den Braber ................ 375/327
2003/0031273 A1* 2/2003 Mohindra .................... 375/324

FOREIGN PATENT DOCUMENTS

DE   3412191   10/1985

* cited by examiner

*Primary Examiner*—David C. Payne
*Assistant Examiner*—Rahel Guarino
(74) *Attorney, Agent, or Firm*—Robert M. McDermott

(57) ABSTRACT

Receiver comprising an RF front end circuit for a selection and conversion of an RF input signal into a pair of quadrature IF (intermediate frequency) signals being supplied through in-phase and phase quadrature signal paths to signal inputs of quadrature phase detection elements, such as in-phase and phase quadrature phase detectors included in a (PLL) phase locked loop, an output of the quadrature phase detection elements being coupled through a loop filter to a control input of a quadrature IF oscillator supplying a pair of quadrature IF oscillator signals to carrier inputs of the quadrature phase detection elements. To suppress amplitude and phase mismatch deteriorating proper mirror cancellation the quadrature phase detection elements is coupled to amplitude and phase error signal for a detection of amplitude and phase errors in the output signal of the quadrature phase detection elements and a quadrature frequency doubler is coupled between the quadrature local oscillator and carrier inputs of the amplitude and phase error detection means to supply respectively thereto in-phase and phase quadrature error detection carrier signals at twice the IF carrier frequency of the pair of quadrature IF signals, the amplitude and phase error detection means respectively providing amplitude and phase error signals through first and second low-pass filters to an amplitude correction circuit and a phase correction circuit preceding at least one of the inputs of the quadrature phase detection elements for a negative feedback of the amplitude and phase errors.

27 Claims, 3 Drawing Sheets

RECEIVER WITH MIRROR FREQUENCY SUPPRESSION

The invention relates to a receiver comprising an RF front end circuit for a selection and conversion of an RF input signal into a pair of quadrature signals being supplied through in-phase and phase quadrature signal paths to signal inputs of quadrature phase detection means included in a (PLL) phase locked loop, an output of said quadrature phase detection means being coupled through a loop filter to a control input of a quadrature IF oscillator supplying a pair of quadrature IF oscillator signals through in-phase and phase quadrature IF carrier paths to carrier inputs of said quadrature phase detection means. Such receiver is on itself known, e.g. from German Patent DE 34 12 191.

Signal processing in receivers of this type generally amounts to the following: the RF front end provides broadband selection and automatic gain controlled amplification of a received RF frequency range and comprises a tuning stage for a conversion of a wanted RF input signal within said received RF frequency range to a predetermined fixed IF (intermediate frequency) using a tuning oscillator generating a tuning oscillator signal at a frequency differing from the carrier frequency of the wanted RF input signal by said fixed IF. In the known receiver, phase splitting is obtained by the use of quadrature mixers in the tuning stage, providing the above pair of quadrature IF signals. Alternatively, phase splitting may be obtained by the use of resonance amplifiers such as known from e.g. U.S. Pat. No. 5,220,686 in the RF or IF signal path. The quadrature IF signals are frequency demodulated in the PLL to obtain the wanted baseband FM modulation signal, which is available at an output of the quadrature phase detection means to be further processed for reproduction. The loop filter selects from an output signal of the quadrature phase detection means a control signal for the IF oscillator varying with the phase differences between the quadrature IF oscillator signals on the one hand and the incoming quadrature IF signals on the other hand. This control signal provides for a negative feed back of any such phase differences to the inputs of the quadrature phase detection means, resulting in the quadrature IF oscillator signals being phase synchronized with the incoming quadrature IF signals.

However, the frequency distribution of the RF transmission signals throughout the received RF frequency range gives rise to frequency dispositions, in which a wanted RF signal finds an unwanted RF signal located around a mirror frequency, i.e. at an RF carrier frequency which in the receiver folds back in or close to the baseband modulation frequency range of the wanted RF signal. Such frequency disposition is depicted in the diagram of FIG. 1A, in which a wanted RF signal W carrying a baseband modulation signal s is located around a carrier frequency $f_W$, and the unwanted signal—hereinafter being referred to as mirror signal M—at a carrier frequency $f_M = f_W + 2*f_{IF} + \Delta f$, in which $f_{IF}$ is the IF receiver frequency and $\Delta f$ as depicted being smaller than the frequency range of the baseband modulation signal s.

In FIG. 1B the frequency disposition of the wanted and mirror signals W and M is depicted in the IF range after RF/IF conversion in the tuning stage. The RF/IF conversion not only provides down conversion of the wanted RF signal W to a positive frequency $f_{IF}$, but also folds the carrier frequency of the unwanted mirror signal M around the tuning oscillator frequency $f_{TO}$ to a negative frequency $f_{IF} + \Delta f$, occurring within the frequency range of the useful baseband signal s of the wanted IF signal W.

The mirror signal M at said negative frequency $f_{IF} + \Delta f$ can be cancelled with an exact RF/IF phase quadrature signal processing. In practice, however, amplitude and/or phase errors due to e.g. parasitic effects, tolerance spread and other sources of mismatch, cannot be completely avoided and many efforts have been made to obtain mirror or image rejection by measures such as precise balancing, accurate matching, narrow tolerances, and/or by the use of polyphase filters, such as known from e.g. the article "CMOS Mixers and Polyphase Filters for Large Image Rejection" by F. Behbahani et al., published in IEEE Journal of Solid-State Circuits, Volume 36, No. 6, June 2001, pages 873-887. The effect of these known measures, however, is limited and results in partly suppressed mirror signals, such as illustrated in FIG. 1C with mirror signal M. Dependent on its frequency location and amplitude, such partly suppressed mirror signal may become noticeable as a strong deterioration of the wanted signal W.

Now, therefore, it is an object of the invention to provide an effective mirror or image rejection which adds to the image rejection obtained by the above known measures, and can be used independent therefrom, and/or which allows to loosen the amplitude and phase matching requirements for image rejection in the known RF/IF quadrature signal processing means.

This object is achieved in a receiver as described in the opening paragraph according to the invention, which is characterized by said quadrature phase detection means being coupled to amplitude and phase error detection means for a detection of amplitude and phase errors in the output signal of said quadrature phase detection means, a quadrature frequency doubler being coupled between the quadrature IF oscillator and carrier inputs of said amplitude and phase error detection means to supply thereto respectively, in-phase and phase quadrature error detection carrier signals at twice the frequency of said quadrature IF oscillator signals, said amplitude and phase error detection means being coupled respectively through first and second low-pass filters to an amplitude correction circuit and a phase correction circuit for a negative feedback of said amplitude and phase errors to said in-phase and phase quadrature signal paths.

The invention is based on the recognition that demodulation of a pair of quadrature IF signals which are mutually not precisely equal in amplitude and/or not precisely phase orthogonal, gives rise to a carrier signal E in baseband at $2*f_{IF}$ carrying the amplitude and phase mismatch or errors, as depicted in FIG. 1D. The larger the amplitude and phase errors, the stronger said $2*f_{IF}$ carrier signal E, and, as explained above, also the stronger the mirror signal M. This means that reduction of said $2*f_{IF}$ carrier signal E, hereinafter also being referred to as mismatch or error signal carrier, will result in a suppression of said mirror signal M.

By applying the invention, both amplitude and phase mismatch of the quadrature IF signals are being detected from said mismatch carrier E at $2*f_{IF}$ and negatively fed back from the output of said quadrature phase detection means to the in-phase and phase quadrature signal paths. As a result of this negative feed back, the mismatch carrier E is strongly suppressed in both amplitude and phase and along therewith also the unwanted mirror signal M in the reproduced wanted baseband modulation signal s. The invention restores the amplitude symmetry and orthogonal phase shift between the in-phase and phase quadrature IF signals, hereinafter in short being referred to as quadrature symmetry, and therewith adds to any eventual mirror suppression obtained by the application of the above known measures.

Apart from the unwanted mirror signal M and the mismatch carrier E at $2*f_{IF}$ the above demodulation of the pair of quadrature IF signals also causes a mirror signal M' to occur at a positive baseband frequency $2*f_{IF}+\Delta f$, which does not depend on any quadrature symmetry mismatch. In view of its frequency distance with regard to the useful baseband modulation signal s, this mirror signal M' can easily be suppressed.

Various forms of implementation of the abovementioned negative feedback of said amplitude and phase errors to said in-phase and phase quadrature signal paths are possible. An indirect form of negative feedback of quadrature symmetry errors is on itself known from U.S. Pat. No. 4633315.

An embodiment of a receiver according to the invention in which the quadrature symmetry of the RF or IF signals is restored directly is characterized by said amplitude and phase correction circuits being included in at least one of the in-phase and phase quadrature signal paths preceding the quadrature phase detection means.

An embodiment of a receiver according to the invention in which the quadrature symmetry of the IF signals is restored indirectly is characterized by said amplitude and phase correction circuits being included in at least one of said in-phase and phase quadrature IF carrier paths between the quadrature IF oscillator and the quadrature phase detection means.

An embodiment of a receiver according to the invention in which the quadrature symmetry of the RF signals is restored indirectly is characterized by the RF front end circuit comprising an RF tuning oscillator supplying a pair of quadrature RF oscillator signals through in-phase and phase quadrature RF carrier paths to carrier inputs of a quadrature tuning stage, said amplitude and phase correction circuits being included in at least one of said in-phase and phase quadrature RF carrier paths preceding said quadrature tuning stage.

An embodiment of a receiver according to the invention in which the quadrature symmetry of the RF signals is restored directly is characterized by the RF front end circuit comprising a quadrature phase splitter converting the RF input signal into a pair of quadrature RF signals followed by said amplitude and phase correction circuits preceding said quadrature tuning stage.

For a simple implementation, said amplitude correction circuit preferably comprises a first multiplier included in at least one of said in-phase and quadrature paths for an amplitude variation of the signal at said input with said amplitude error.

To balance out spurious response and DC offset from the amplitude correction circuit, an embodiment of a receiver according to the invention is characterized by said amplitude correction circuit comprising a differential stage following said first low pass filter converting said amplitude error into a differential pair of first and second amplitude error signals and supplying the same to said first and a second multiplier, respectively, said first and second multipliers being included in said in-phase and phase quadrature paths.

For a simple implementation of the phase correction circuit, an embodiment of a receiver according to the invention is characterized by said phase correction device comprising a third multiplier having a signal input coupled to one of said in-phase and quadrature paths and a signal output coupled to a first adder device, which is included in the other of said in-phase and quadrature paths for supplying thereto a part of the signal occurring at said one path to said other path varying with said phase error.

To balance out spurious response and DC offset from the phase correction circuit, an embodiment of a receiver according to the invention is characterized by said phase correction circuit comprising a differential stage following said second low pass filter converting said phase error into a differential pair of first and second phase error signals and supplying the same to modulation signal inputs of said third and a fourth multiplier, respectively, said third and fourth multipliers having inputs coupled to the phase quadrature and in-phase paths and having outputs coupled to said first and a second adder device, which are included in said in-phase and phase quadrature paths, respectively.

To obtain a proper control signal for quadrature IF oscillator, crossing zero level at phase lock, said quadrature phase detection means preferably comprises in-phase and phase quadrature phase detectors, signal inputs thereof being supplied with in-phase and phase quadrature IF signals of said pair of quadrature IF signals, carrier inputs thereof being respectively supplied with phase quadrature and in-phase IF oscillator signals of said pair of quadrature IF oscillator signals and in-phase and phase quadrature outputs thereof being coupled to inputs of a subtracting stage, an output of said subtracting stage being coupled through a loop filter to a control input of said quadrature IF oscillator.

An embodiment of a receiver according to the invention using the baseband FM modulation signal included in the output signal of the quadrature phase detection means is characterized by an output of said subtracting stage being coupled to a baseband FM modulation signal processor.

An embodiment of a receiver according to the invention allowing to eliminate mirror signals from a wanted baseband amplitude modulation signal is characterized by quadrature amplitude demodulation means, comprising in-phase and phase quadrature synchronous amplitude detectors, signal inputs thereof being supplied with said in-phase and phase quadrature IF signals, carrier inputs thereof being respectively supplied with said in-phase and phase quadrature IF oscillator signals and in-phase and phase quadrature outputs thereof being coupled to inputs of an adding stage, an output of said adding stage being coupled through a loop filter to a baseband AM modulation signal processor.

These and further aspects and advantages of the invention will be discussed more in detail hereinafter with reference to the disclosure of preferred embodiments, and in particular with reference to the appended Figures, wherein FIG. 1A is an amplitude (A)—frequency (f) diagram showing the frequency disposition of a wanted RF signal carrying a baseband modulation signal s, and its unwanted mirror signal within a received RF frequency range;

Figure 1A:
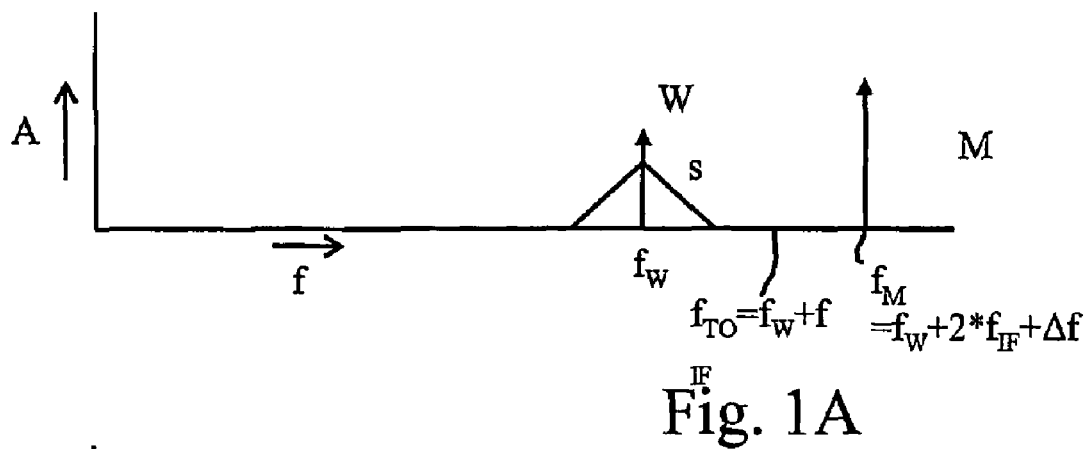
FIG. 1B is an amplitude (A)—frequency (f) diagram showing the wanted signal and its unwanted mirror signal within the IF frequency range.
FIG. 1C is an amplitude (A)—frequency (f) diagram showing the wanted IF signal and its unwanted partly suppressed IF mirror signal.
FIG. 1D is an amplitude (A)—frequency (f) diagram showing the wanted IF signal, its unwanted partly suppressed IF mirror signal and a mismatch carrier E at $2*f_{IF}$ in a baseband frequency range.
Figure 1B:
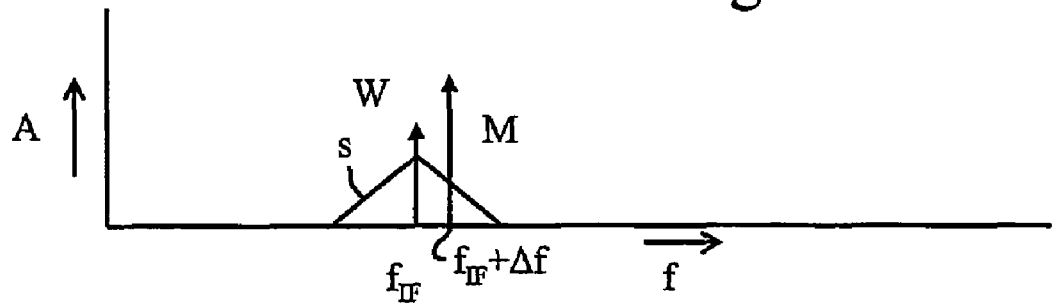
Figure 1C:
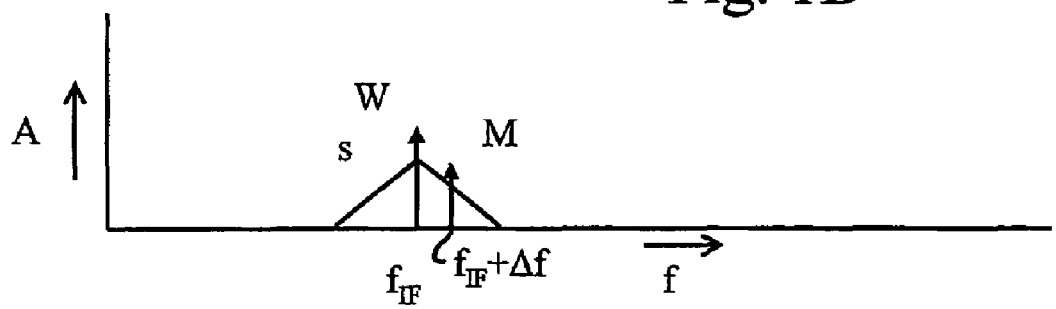
Figure 1D:
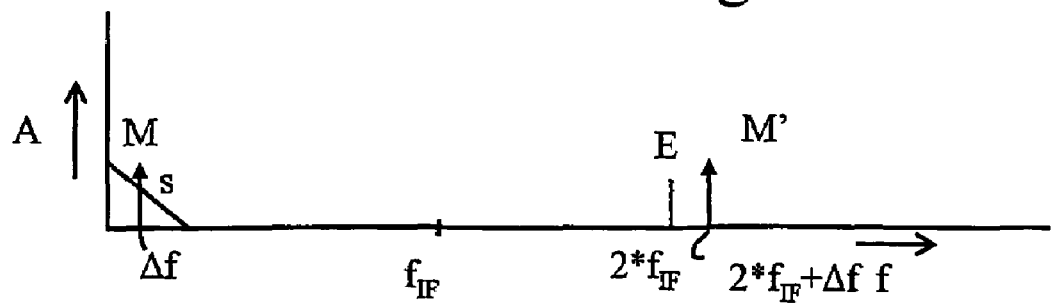
Figure 2A:
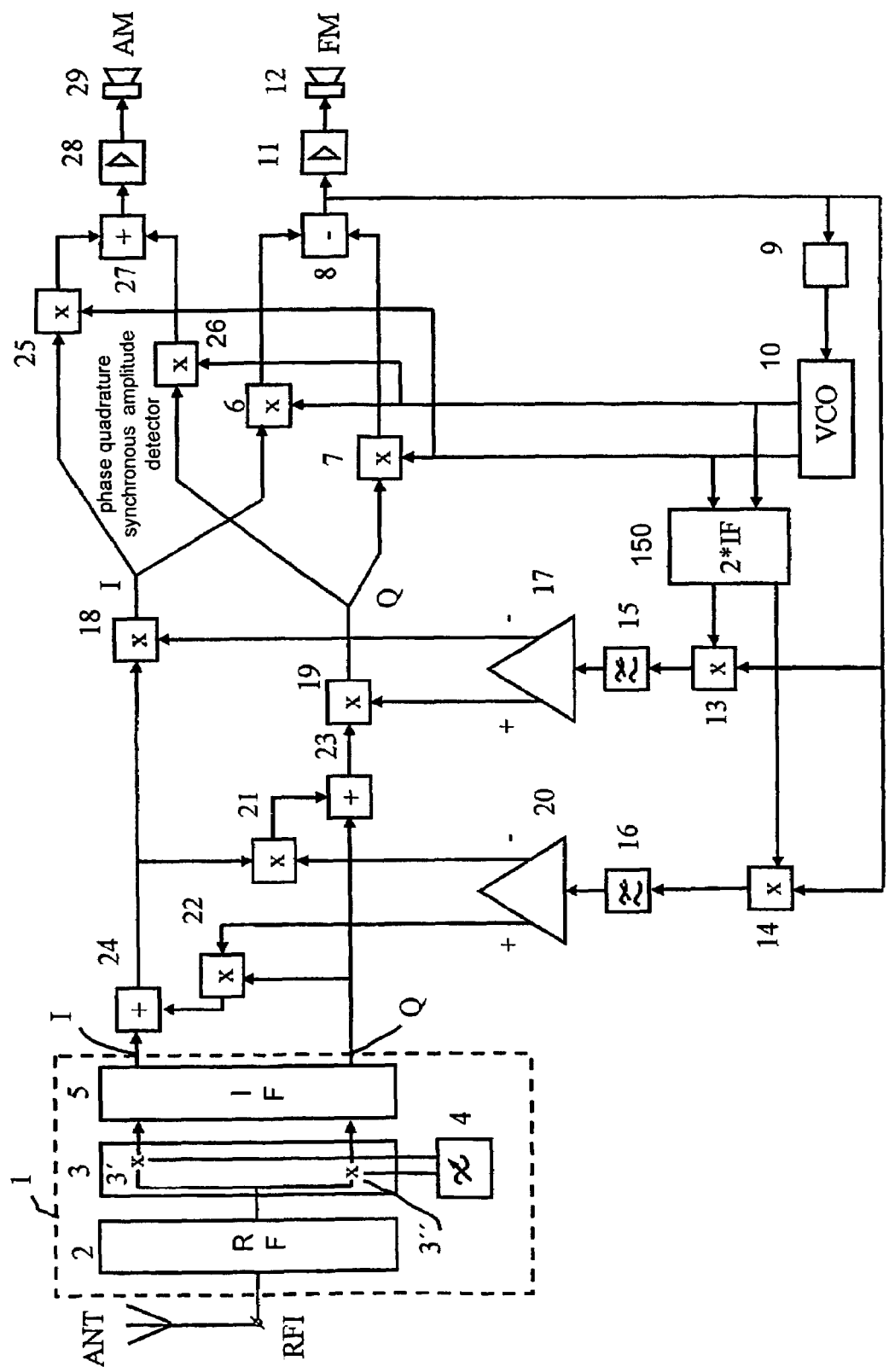
FIG. 2A shows a preferred embodiment of a receiver according to the invention. In the Figures, identical parts are provided with the same reference numbers.

FIG. 2A shows a receiver according to the invention comprising an RF front end circuit 1 being supplied with an RF input frequency range from antenna means ANT through an RF input RFI and including subsequently coupled to said RF input RFI, an RF input stage 2 for a broadband selection and automatic gain controlled amplification of said RF input frequency range, a tuning stage 3 being provided with a quadrature pair of tuning mixers 3' and 3" supplied with a pair of quadrature tuning oscillator signals provided by a quadrature tuning oscillator 4 for a conversion of a wanted RF signal within the RF input frequency range to a predetermined fixed IF (intermediate frequency) and simultaneous quadrature phase splitting, resulting in a pair of quadrature IF signals, the in-phase IF signal thereof being supplied to an in-phase signal path I, the phase quadrature IF signal thereof being supplied to a phase quadrature signal path Q, and an IF stage 5 for a narrowband channel selection and amplification of said pair of quadrature IF signals. The IF stage 5 may include an IF polyphase filter such as known from the above cited article "CMOS Mixers and Polyphase Filters for Large Image Rejection" by F. Behbahani et al., published in IEEE Journal of Solid-State Circuits, Volume 36, No. 6, June 2001, pages 873-887. The frequency of said pair of quadrature tuning oscillator signals differs from the carrier frequency of the wanted RF input signal by said fixed IF. The pair of quadrature IF signals is being supplied from outputs of said IF stage 5 through said in-phase and phase quadrature signal paths I and Q to signal inputs of quadrature phase detection means 6-8, comprising in-phase and phase quadrature phase detectors 6 and 7 respectively, carrier inputs thereof being respectively supplied with phase quadrature and in-phase IF oscillator signals of a pair of quadrature IF oscillator signals and in-phase and phase quadrature outputs thereof being coupled to inputs of a subtracting stage 8, an output of said subtracting stage 8 being coupled through a loop filter 9 to a control input of a quadrature IF oscillator 10. The quadrature phase detection means 6-8 together with the loop filter 9 and the quadrature IF oscillator 10 form a phase locked loop, in which phase differences between the pair of quadrature IF signals on the one hand and the pair of quadrature IF oscillator signals on the other hand are being measured by the quadrature phase detection means 6-8 and negatively fed back from the output of the subtracting stage 8 through the control signal of the quadrature IF oscillator 10 to said pair of quadrature IF oscillator signals. This results in a suppression of said phase differences, which is at maximum in the in-lock state of the PLL, in which the pair of quadrature IF oscillator signals is fully phase synchronized with the incoming pair of quadrature IF signals. In this in-lock state of the PLL the output signal of the quadrature phase detection means 6-8 provides the baseband FM modulation signal, which is supplied to a baseband FM modulation signal processor 11 followed by a loudspeaker device 12 for reproduction of said baseband FM modulation signal.

The receiver described so far corresponds to the above known receiver and needs no further amplification for a proper understanding of the invention.

As explained above with reference to FIGS. 1A-1D, mismatch in the quadrature RF/IF signal processing, causing the quadrature IF signals to mutually deviate from quadrature symmetry, i.e. to mutually differ in amplitude and/or to mutually differ in phase from a 90° phase shift, deteriorate proper cancellation of mirror signals at negative frequencies, such as the mirror signal M shown in FIGS. 1A-1D. According to the invention, mirror cancellation is obtained by an accurate detection and suppression of said amplitude and phase mismatch as will now be explained in more detail.

Suppose the amplitude mismatch or amplitude error of the pair of in-phase and phase quadrature IF signals IFI and IFQ in the in-phase and phase quadrature signal paths I and Q, respectively, is $\delta A$ and the phase mismatch or phase error $\delta\Phi$ is zero. Then with $\omega_{IF}=2\pi f_{IF}$, IFI and IFQ are defined by:

IFI=$(1+\delta A)^* \cos \omega_{IF} t$

IFQ=$\sin \omega_{IF} t$

With VCOI and VCOQ being the in-phase and phase quadrature IF oscillator signals of the pair of quadrature IF oscillator signals, without amplitude error $\delta A$ and with phase error $\phi$ with respect to IFI and IFQ, these signals can be written as:

VCOI=$\cos(\omega_{IF} t+\phi)$

VCOQ=$\sin(\omega_{IF} t+\phi)$

The quadrature phase detection means 6-8 provides at its output a phase detector output signal PDOUT, defined by IFI*VCOQ−IFQ*VCOI with amplitude error $\delta A$ and phase error $\phi$.

PDOUT=IFI*VCOQ−IFQ*VCOI

PDOUT=$(1=\delta A)^* \cos \omega_{IF} t^* \sin(\omega_{IF} t+\phi)-\sin \omega_{IF} t^* \cos (\omega_{IF} t+\phi)$ PDOUT=$\cos \omega_{IF} t^* \sin(\omega_{IF} t+\phi)-\sin \omega_{IF} t^* \cos(\omega_{IF} t+\phi)+\delta A^* \cos \omega_{IF} t^* \sin(\omega_{IF} t+\phi)$ PDOUT=$\sin(\phi)+\delta A^* \cos \omega_{IF} t^* \sin(\omega_{IF} t+\phi)$ In the in-lock state of the PLL 6-10, the phase error $\phi$ is fully suppressed ($\phi$−22 0) as explained above, resulting in:

PDOUT=$\sin(0)+\delta A/2^* 2^* \cos \omega_{IF} t^* \sin(\omega_{IF} t)$

PDOUT=$\delta A/2^* \sin(2^* \omega_{IF} t)$

This means that in the in-lock state of the PLL 6-10, the amplitude of the unwanted mirror signal M is present at the output of the quadrature phase detection means 6-8 as an amplitude modulated signal $\delta A/2^* \sin(2^*\omega_{IF} t)$ at a carrier of two times the intermediate frequency $f_{IF}$. With a synchronous amplitude detector using an in-phase (i.e. sinus-phase) detection carrier at the frequency $2^* f_{IF}$ and a low pass filter the amplitude error $\delta A$ can be detected and reduced in a loop with negative feedback as will be described in further detail hereinafter.

Suppose the pair of in-phase and phase quadrature IF signals IFI and IFQ in the in-phase and phase quadrature signal paths I and Q, respectively, having a mutual phase deviation differing from 90° by a phase error $\delta\Phi$ without amplitude error. Then:

IFI=$\cos \omega_{IF} t+\delta\Phi^* \sin(\omega_{IF} t)$

IFQ=$\sin \omega_{IF} t$

In the in-lock state of the PLL, i.e. with phase error $\phi$ being zero and without amplitude error $\delta A$ and phase error $\delta\Phi$, the in-phase and phase quadrature IF oscillator signals can be written as:

VCOI=$\cos \omega_{IF} t$

VCOQ=$\sin \omega_{IF} t$

The quadrature phase detection means 6-8 provides at its output a phase detector output signal PDOUT, defined by IFI*VCOQ−IFQ*VCOI with phase error $\delta\Phi$ only.

PDOUT=IFI*VCOQ−IFQ*VCOI

PDOUT=$(\cos \omega_{IF} t+\delta\Phi^* \sin \omega_{IF} t)^* \sin \omega_{IF} t-\sin \omega_{IF} t^* \cos \omega_{IF} t$ PDOUT=$\cos \omega_{IF} t^* \sin \omega_{IF} t-\sin \omega_{IF} t^* \cos \omega_{IF} t+\delta\Phi^* \sin \omega_{IF} t^* \sin \omega_{IF} t$ PDOUT=$0+\delta\Phi^* \sin \omega_{IF} t^* \sin \omega_{IF} t$ PDOUT=$0+\delta\Phi/2^* (1-\cos (2^* \omega_{IF} t))$ PDOUT=$\delta\Phi/2-\delta\Phi/2^* \cos (2^* \omega_{IF} t)$ This means that in the in-lock state of the PLL 6-10, an amplitude error $\delta\Phi$ is present at the output of the phase detector as an additional phase error and at the same time as amplitude modulated signal−$\delta\Phi/2 ^* \cos(2^* \omega_{IF} t)$ as a carrier of two times the intermediate frequency $f_{IF}$, also being referred to as mismatch or error signal carrier E. With a synchronous amplitude detector using a quadrature phase (i.e. cosinus-phase) detection carrier at the frequency $2*f_{IF}$ and a low pass filter the phase error $\delta\Phi$ can be detected and reduced in a loop with negative feedback as will be described in further detail hereinafter.

According to the invention, the output of said quadrature phase detection means 6-8 is coupled to amplitude and phase error detection means 13 and 14 being consituted by synchronous amplitude and phase detectors for a detection of amplitude and phase errors $\delta A$ and $\delta\Phi$ in the output signal of said quadrature phase detection means 6-8 caused by amplitude and/or phase mismatches in the quadrature receiver signal processing due to e.g. parasitic effects, tolerance spread and other sources of mismatch. A quadrature frequency doubler 150 is coupled between the quadrature IF oscillator 10 and carrier inputs of said amplitude and phase error detection means 13 and 14 to supply respectively thereto in-phase and phase quadrature error detection carrier signals at twice said IF carrier frequency, i.e. at $2*f_{IF}$, said amplitude and phase error detection means 13 and 14 providing amplitude and phase error signals $\delta A$ and $\delta\Phi$ through first and second low-pass filters 15 and 16 to an amplitude correction circuit 17-19 and a phase correction circuit 20-24 preceding the signal inputs of said quadrature phase detection means 6-8 for a negative feedback of said amplitude and phase errors $\delta A$ and $\delta\Phi$ to said in-phase and phase quadrature signal paths I and Q. Due to this negative feed back, any occurrence of amplitude and phase errors $\delta A$ and $\delta\Phi$ in the output signal of the quadrature phase detection means 6-8 is followed by a correction of these errors in the signals of the in-phase and phase quadrature signal paths I and Q, resulting in a suppression of the initial amplitude and phase errors and therewith in a suppression of the baseband mirror signal M, in the given example of FIG. 1D occurring at a baseband frequency $\Delta f$.

The frequency doubler 150 may be constituted by a known frequency doubler such as disclosed in e.g. U.S. Pat. No. 5,389,886.

The amplitude correction circuit 17-19 comprises a differential stage 17 following said first low pass filter 15 converting said amplitude error signal $\delta A$ into a differential pair of first and second amplitude error signals $+0.5\delta A$ and $-0.5\delta A$ and supplying the same to first and second multipliers 18 and 19, respectively, said first and second multipliers 18 and 19 being included in said in-phase and phase quadrature signal paths I and Q preceding the signal inputs of quadrature phase detection means 6-8.

The phase correction circuit 20-24 comprises a differential stage 20 following said second low pass filter 16 converting said phase error signal $\delta\Phi$ into a differential pair of first and second phase error signals $+0,5\delta\Phi$ and $-0.5\delta\Phi$ and supplying the same to modulation signal inputs of third and fourth multipliers 21 and 22, respectively, said third and a fourth multipliers 21 and 22 having inputs coupled to the in-phase and phase quadrature signal paths I and Q and having outputs coupled through said first and a second adder device 23 and 24 to the phase quadrature and in-phase signal paths Q and I, respectively, preceding the signal inputs of quadrature detection means 6-8.

For the reception of AM signals, the receiver is provided with quadrature amplitude demodulation means 25-27, comprising in-phase and phase quadrature synchronous amplitude detectors 25 and 26, signal inputs thereof being supplied with the above in-phase and phase quadrature IF signals IFI and IFQ, carrier inputs thereof being respectively supplied with the in-phase and phase quadrature IF oscillator signals VCOI and VCOQ and in-phase and phase quadrature outputs thereof being coupled to inputs of an adding stage 27, an output of said adding stage 27 being coupled through a baseband AM modulation signal processor 28 to a loudspeaker device 29.

Figure 2B:
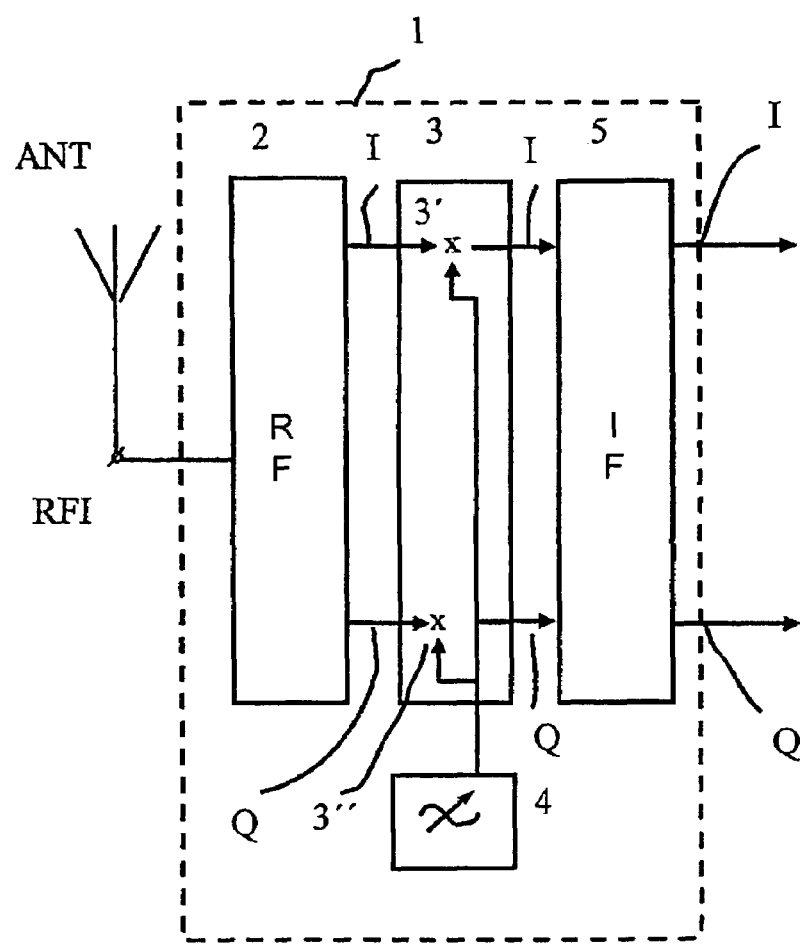
FIG. 2B shows an alternative embodiment of a RF front end circuit for use in a receiver according to the invention.

FIG. 2B shows quadrature phase splitting obtained in the RF input stage 2 by the use of resonance amplifiers such as known from e.g. U.S. Pat. No. 5,220,686, converting the single phase RF input signal into a pair of quadrature RF signals being supplied to in-phase and phase quadrature RF signal paths. In this alternative embodiment of the RF front end circuit 1, the amplitude and phase correction means 18, 19 and 21-24, respectively, may be included in said in-phase and phase quadrature RF signal paths preceding the quadrature tuning stage 3, whereas only a single phase oscillator signal is needed for an RF to IF conversion of said pair of quadrature RF signals.

The invention is not limited to the embodiments explicitly disclosed. It may well be possible without leaving the scope and spirit of the invention, to dispense with the differential stages 17 and 20 e.g. by correcting for both phase and amplitude mismatch in either the in-phase signal path I only, or in the phase quadrature signal path Q only, or to carry out such corrective measure indirectly on the signals of the in-phase and phase quadrature IF signal paths I and Q through a quadrature symmetry correction of the in-phase and phase quadrature IF oscillator signals VCOI and VCOQ of the local IF oscillator 10 preceding the carrier inputs of the quadrature phase detection means 6-8, such as on itself known from U.S. Pat. No. 4,633,315. Such indirect correction of the quadrature symmetry of the signals in the in-phase and phase quadrature RF signal paths I and Q may well be possible by a correction of the in-phase and phase quadrature tuner oscillator signals of the tuning oscillator 4 preceding the carrier inputs of the quadrature pair of tuning mixers of the tuning stage 3.

The invention is embodied in each new characteristic and each combination of characteristics. Any reference signs do not limit the scope of the claims. The word "comprising" does not exclude the presence of other elements than those listed in a claim. Use of the word "a" or "an" preceding an element does not exclude the presence of a plurality of such elements.

The invention claimed is:

1. A receiver comprising:
  an RF front end circuit,
  quadrature phase detectors,
  a quadrature IF oscillator,
  an amplitude error detector,
  a phase error detector,
  a quadrature frequency doubler,
  an amplitude correction circuit, and
  a phase correction circuit,
  wherein
    the RF front end circuit is configured for selection and conversion of an RF input signal into a pair of quadrature signals that are supplied through in-phase and phase quadrature signal paths to signal inputs of the quadrature phase detectors, which are included in a (PLL) phase locked loop,
    an output of the quadrature phase detectors are coupled through a loop filter to a control input of the quadrature IF oscillator,
    the quadrature IF oscillator is configured to supply a pair of quadrature IF oscillator signals through in-phase and phase quadrature IF carrier paths to carrier inputs of the quadrature phase detectors,
    the quadrature phase detectors are coupled to the amplitude and phase error detectors for a detection of amplitude and phase errors in the output signal of the quadrature phase detectors, the quadrature frequency doubler is coupled between the quadrature IF oscillator and carrier inputs of the amplitude and phase error detectors to supply thereto respectively, in-phase and phase quadrature error detection carrier signals at twice the frequency of the quadrature IF oscillator signals, and the amplitude and phase error detectors are coupled respectively through first and second low-pass filters to the amplitude correction circuit and the phase correction circuit for a negative feedback of the amplitude and phase errors to the in-phase and phase quadrature signal paths.

2. A receiver as claimed in claim 1, wherein
the amplitude and phase correction circuits are included in at least one of the in-phase and phase quadrature signal paths preceding the quadrature phase detectors.

3. A receiver as claimed in claim 1, wherein
the amplitude and phase correction circuits are included in at least one of the in-phase and phase quadrature IF carrier paths between the quadrature IF oscillator and the quadrature phase detectors.

4. A receiver as claimed in claim 1, wherein
the RF front end circuit comprises
an RF tuning oscillator that is configured to supply a pair of quadrature RF oscillator signals through in-phase and phase quadrature RF carrier paths to carrier inputs of a quadrature tuning stage, and
the amplitude and phase correction circuits are included in at least one of the in-phase and phase quadrature RF carrier paths preceding the quadrature tuning stage.

5. A receiver as claimed in claim 1, wherein
the RF front end circuit comprises
a quadrature phase splitter that is configured to convert the RF input signal into a pair of quadrature RF signals followed by the amplitude and phase correction circuits preceding the quadrature tuning stage.

6. A receiver as claimed in claim 1, wherein
the amplitude correction circuit comprises
a first multiplier included in at least one of the in-phase and quadrature paths for an amplitude variation of the signal at the input with the amplitude error.

7. A receiver as claimed in claim 6, wherein
the amplitude correction circuit comprises
a differential stage following the first low pass filter converting the amplitude error into a differential pair of first and second amplitude error signals and supplying the same to the first and a second multiplier, respectively, and
the first and second multipliers are included in the in-phase and phase quadrature paths.

8. A receiver as claimed in claim 7, wherein
the phase correction device comprises
a third multiplier having a signal input coupled to one of the in-phase and quadrature paths and a signal output coupled to a first adder device, and
the first adder device is included in the other of the in-phase and quadrature paths for supplying thereto a part of the signal occurring at the one path to the other path varying with the phase error.

9. A receiver as claimed in claim 8, wherein
the phase correction circuit comprises
a differential stage following the second low pass filter that is configured to convert the phase error into a differential pair of first and second phase error signals and to supply the same to modulation signal inputs of the third and a fourth multiplier, respectively, the third and fourth multipliers having inputs coupled to the phase quadrature and in-phase paths and having outputs coupled to the first and a second adder device, which are included in the in-phase and phase quadrature paths, respectively.

10. A receiver as claimed in claim 1, wherein
the quadrature phase detectors comprise
in-phase and phase quadrature phase detectors,
signal inputs thereof being supplied with in-phase and phase quadrature IF signals of the pair of quadrature IF signals,
carrier inputs thereof being respectively supplied with phase quadrature and in-phase IF oscillator signals of the pair of quadrature IF oscillator signals and
in-phase and phase quadrature outputs thereof being coupled to inputs of a subtracting stage,
an output of the subtracting stage being coupled through a loop filter to a control input of the quadrature IF oscillator.

11. A receiver as claimed in claim 10, wherein
the output of the subtracting stage is coupled to a baseband FM modulation signal processor.

12. A receiver as claimed in claim 1, further including
a quadrature amplitude demodulator, comprising
in-phase and phase quadrature synchronous amplitude detectors,
signal inputs thereof being supplied with the in-phase and phase quadrature IF signals,
carrier inputs thereof being respectively supplied with the in-phase and phase quadrature IF oscillator signals and
in-phase and phase quadrature outputs thereof being coupled to inputs of an adding stage,
an output of the adding stage being coupled through a loop filter to a baseband AM modulation signal processor.

13. A receiver as claimed in claim 3, wherein
the amplitude correction circuit comprises
a first multiplier included in at least one of the in-phase and quadrature paths for an amplitude variation of the signal at the input with the amplitude error.

14. A receiver as claimed in claim 4, wherein
the amplitude correction circuit comprises
a first multiplier included in at least one of the in-phase and quadrature paths for an amplitude variation of the signal at the input with the amplitude error.

15. A receiver as claimed in claim 5, wherein
the amplitude correction circuit comprises
a first multiplier included in at least one of the in-phase and quadrature paths for an amplitude variation of the signal at the input with the amplitude error.

16. A receiver as claimed in claim 13, wherein
the amplitude correction circuit comprises
a differential stage following the first low pass filter converting the amplitude error into a differential pair of first and second amplitude error signals and supplying the same to the first and a second multiplier, respectively, and the first and second multipliers are included in the in-phase and phase quadrature paths.

17. A receiver as claimed in claim 14, wherein
the amplitude correction circuit comprises
a differential stage following the first low pass filter converting the amplitude error into a differential pair of first and second amplitude error signals and supplying the same to the first and a second multiplier, respectively, and
the first and second multiplier are included in the in-phase and phase quadrature paths.

18. A receiver as claimed in claim 15, wherein
the amplitude correction circuit comprises
a differential stage following the first low pass filter converting the amplitude error into a differential pair of first and second amplitude error signals and supplying the same to the first and a second multiplier, respectively, and
the first and second multipliers are included in the in-phase and phase quadrature paths.

19. A receiver as claimed in claim 16, wherein
the phase correction device comprises
a third multiplier having a signal input coupled to one of the in-phase and quadrature paths and a signal output coupled to a first adder device, and
the first adder device is included in the other of the in-phase and quadrature paths for supplying thereto a part of the signal occurring at the one path to the other path varying with the phase error.

20. A receiver as claimed in claim 17, wherein
the phase correction device comprises
a third multiplier having a signal input coupled to one of the in-phase and quadrature paths and a signal output coupled to a first adder device, and
the first adder device is included in the other of the in-phase and quadrature paths for supplying thereto a part of the signal occurring at the one path to the other path varying with the phase error.

21. A receiver as claimed in claim 18, wherein
the phase correction device comprises
a third multiplier having a signal input coupled to one of the in-phase and quadrature paths and a signal output coupled to a first adder device, and
the first adder device is included in the other of the in-phase and quadrature paths for supplying thereto a part of the signal occurring at the one path to the other path varying with the phase error.

22. A receiver as claimed in claim 4, wherein
the quadrature phase detectors comprise
in-phase and phase quadrature phase detectors,
signal inputs thereof being supplied with in-phase and phase quadrature IF signals of the pair of quadrature IF signals,
carrier inputs thereof being respectively supplied with phase quadrature and in-phase IF oscillator signals of the pair of quadrature IF oscillator signals and
in-phase and phase quadrature outputs thereof being coupled to inputs of a subtracting stage,
an output of the subtracting stage being coupled through a loop filter to a control input of the quadrature IF oscillator.

23. A receiver as claimed in claim 5, wherein
the quadrature phase detectors comprise
in-phase and phase quadrature phase detectors,
signal inputs thereof being supplied with in-phase and phase quadrature IF signals of the pair of quadrature IF signals,
carrier inputs thereof being respectively supplied with phase quadrature and in-phase IF oscillator signals of the pair of quadrature IF oscillator signals and
in-phase and phase quadrature outputs thereof being coupled to inputs of a subtracting stage,
an output of the subtracting stage being coupled through a loop filter to a control input of the quadrature IF oscillator.

24. A receiver as claimed in claim 7, wherein
the quadrature phase detectors comprise
in-phase and phase quadrature phase detectors,
signal inputs thereof being supplied with in-phase and phase quadrature IF signals of the pair of quadrature IF signals,
carrier inputs thereof being respectively supplied with phase quadrature and in-phase IF oscillator signals of the pair of quadrature IF oscillator signals and
in-phase and phase quadrature outputs thereof being coupled to inputs of a subtracting stage,
an output of the subtracting stage being coupled through a loop filter to a control input of the quadrature IF oscillator.

25. A receiver as claimed in claim 9, wherein
the quadrature phase detectors comprise
in-phase and phase quadrature phase detectors,
signal inputs thereof being supplied with in-phase and phase quadrature IF signals of the pair of quadrature IF signals,
carrier inputs thereof being respectively supplied with phase quadrature and in-phase IF oscillator signals of the pair of quadrature IF oscillator signals and
in-phase and phase quadrature outputs thereof being coupled to inputs of a subtracting stage,
an output of the subtracting stage being coupled through a loop filter to a control input of the quadrature IF oscillator.

26. A receiver as claimed in claim 25, wherein
the output of the subtracting stage is coupled to a baseband FM modulations signal processor.

27. A receiver as claimed in claim 26, further including
a quadrature amplitude demodulator comprising
in-phase and phase quadrature synchronous amplitude detectors,
signal inputs thereof being supplied with the in-phase and phase quadrature IF signals,
carrier inputs thereof being respectively supplied with the in-phase and phase quadrature IF oscillator signals and
in-phase and phase quadrature outputs thereof being coupled to inputs of an adding stage,
an output of the adding stage being coupled through a loop filter to a baseband AM modulation signal processor.

* * * * *